(12) United States Patent
Hao et al.

(10) Patent No.: US 10,804,259 B2
(45) Date of Patent: Oct. 13, 2020

(54) ELECTROSTATIC PROTECTION CIRCUIT, DISPLAY PANEL, AND DISPLAY APPARATUS

(71) Applicant: BOE TECHNOLOGY GROUP CO., LTD., Beijing (CN)

(72) Inventors: Xueguang Hao, Beijing (CN); Yong Qiao, Beijing (CN); Hongfei Cheng, Beijing (CN); Xinyin Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 449 days.

(21) Appl. No.: 15/647,187

(22) Filed: Jul. 11, 2017

(65) Prior Publication Data
US 2018/0061825 A1  Mar. 1, 2018

(30) Foreign Application Priority Data

Aug. 31, 2016  (CN) .................... 2016 2 1032763 U

(51) Int. Cl.
| | | |
|---|---|---|
| *H01L 27/02* | (2006.01) | |
| *G02F 1/1362* | (2006.01) | |
| *H01L 27/12* | (2006.01) | |

(52) U.S. Cl.
CPC .... *H01L 27/0281* (2013.01); *G02F 1/136204* (2013.01); *H01L 27/0266* (2013.01); *H01L 27/0288* (2013.01); *H01L 27/1244* (2013.01)

(58) Field of Classification Search
CPC ............. H01L 27/0266; H01L 27/0281; H01L 27/0288; H01L 27/1244; G02F 1/136204; H02H 9/04–046
See application file for complete search history.

(56) References Cited

U.S. PATENT DOCUMENTS

2009/0174975 A1* 7/2009 Huang ................. G09G 3/3611
361/56

* cited by examiner

*Primary Examiner* — Jared Fureman
*Assistant Examiner* — Christopher J Clark
(74) *Attorney, Agent, or Firm* — Kinney & Lange, P.A.

(57) ABSTRACT

An electrostatic protection circuit, a display panel, and a display apparatus are disclosed. The electrostatic protection circuit comprises a switch control unit, a first electrostatic storage unit configured to store charges, and a second electrostatic storage unit configured to store charges, wherein the first electrostatic storage unit has a first terminal connected to a driving line and a second terminal connected to the switch control unit, and the second electrostatic storage unit has a first terminal connected to the switch control unit and a second terminal connected to a common electrode trace. With the first electrostatic storage unit connected to the driving line and the second electrostatic storage unit connected to the common electrode trace, the electrostatic protection circuit, the display panel, and the display apparatus according to the present disclosure can prevent leakage current on the driving line from flowing into the common electrode trace or prevent leakage current on the common electrode trace from flowing into the driving line after the switch control unit is switched off, which otherwise causes voltage fluctuation on the driving line or the common electrode trace thereby affecting the display quality.

7 Claims, 2 Drawing Sheets

ELECTROSTATIC PROTECTION CIRCUIT, DISPLAY PANEL, AND DISPLAY APPARATUS

CROSS-REFERENCE TO RELATED APPLICATION(S)

This application claims priority to the Chinese Patent Application No. 201621032763.5, filed on Aug. 31, 2016, entitled "ELECTROSTATIC PROTECTION CIRCUIT, DISPLAY PANEL, AND DISPLAY APPARATUS", which is incorporated herein by reference in its entirety.

TECHNICAL FIELD

The present disclosure relates to the field of electrostatic protection technology, and more particularly, to an electrostatic protection circuit, a display panel, and a display apparatus.

BACKGROUND

In semiconductor devices, Electro Static Discharge (ESD) is a common undesirable phenomenon. ESD may cause breakdown of an insulating medium, thereby resulting in a drift of a threshold voltage or a short circuit between a gate electrode and a source/drain electrode.

When a film transistor device is in operation, if charges on a data scanning line or a gate scanning line are accumulated to a certain extent, breakdown of an insulating medium film which separates a gate electrode from a source/drain electrode may occur, which results in a short circuit between the source electrode and the gate electrode (DGS). Even if breakdown of the insulating layer does not occur, accumulation of electrostatic charges may cause a voltage difference between the gate electrode and the source electrode, which results in a drift of a threshold voltage of the Thin Film Transistor (TFT) and thus changes operating characteristics of the TFT.

Currently, in order to reduce the influence of electrostatic charges at a high voltage on a display panel, an electrostatic protection circuit is usually used to release the electrostatic charges at a high voltage generated in a manufacturing process of a Thin Film Transistor-Liquid Crystal Display (TFT-LCD) or maintain equalization between charges inside the panel and charges outside the panel, so as to solve the problem in the prior art that excessive leakage current is prone to occur on the data scanning line/gate scanning line and a common electrode line/wiring after the TFT is switched off, which causes voltage fluctuation, thereby resulting in poor display and affecting the display quality.

SUMMARY

The present disclosure primarily aims to provide an electrostatic protection circuit, a display panel, and a display apparatus, to solve the problem in the prior art that when a voltage on the driving line or a voltage on the common electrode trace suddenly changes, large leakage current occurs, which affects the voltage on the driving line or the voltage on the common electrode trace, thereby resulting in poor display and affecting the display quality.

In order to achieve the above purpose, the present disclosure provides an electrostatic protection circuit, comprising: a switch control unit; a first electrostatic storage unit configured to store charges and a second electrostatic storage unit configured to store charges; wherein the first electrostatic storage unit has a first terminal connected to a driving line and a second terminal connected to the switch control unit; and the second electrostatic storage unit has a first terminal connected to the switch control unit and a second terminal connected to a common electrode trace, the switch control unit is configured to control the second terminal of the first electrostatic storage unit to be connected to the common electrode trace when a voltage variation value of a voltage on the driving line during a predetermined time period is greater than a first predetermined voltage variation value, and control the first terminal of the second electrostatic storage unit to be connected to the driving line when a voltage variation value of a voltage on the common electrode trace during a predetermined time period is greater than a second predetermined voltage variation value.

In an implementation, the driving line comprises a data scanning line and/or a gate scanning line, and the common electrode trace comprises a common electrode line and/or a common electrode wiring.

In an implementation, the first electrostatic storage unit comprises a first capacitor, and the second electrostatic storage unit comprises a second capacitor.

In an implementation, the switch control unit comprises:

a first switch transistor having a first terminal connected to the driving line, a second terminal connected to the second terminal of the first electrostatic storage unit, and a third terminal connected to a first node;

a second switch transistor having a first terminal connected to the first node, a second terminal connected to the driving line, and a third terminal connected to the first terminal of the second electrostatic storage unit;

a third switch transistor having a first terminal connected to the common electrode trace, a second terminal connected to the first node, and a third terminal connected to the common electrode trace; and a fourth switch transistor having a first terminal connected to the first terminal of the second electrostatic storage unit, a second terminal connected to the first node, and a third terminal connected to the common electrode trace.

In an implementation, the switch control unit comprises:

a first switch transistor having a first terminal connected to the driving line, a second terminal connected to the driving line, and a third terminal connected to a first node;

a second switch transistor having a first terminal connected to the first node, a second terminal connected to the second terminal of the first electrostatic storage unit, and a third terminal connected to the first terminal of the second electrostatic storage unit;

a third switch transistor having a first terminal connected to the common electrode trace, a second terminal connected to the first node, and a third terminal connected to the common electrode trace; and a fourth switch transistor having a first terminal connected to the first terminal of the second electrostatic storage unit, a second terminal connected to the first node, and a third terminal connected to the first terminal of the second electrostatic storage unit.

In an implementation, all of the first switch transistor, the second switch transistor, the third switch transistor, and the fourth switch transistor are N-type transistors or all of the first switch transistor, the second switch transistor, the third switch transistor, and the fourth switch transistor are P-type transistors.

The present disclosure further provides a display panel, comprising the electrostatic protection circuit described above.

The present disclosure further provides a display apparatus, comprising the display panel described above.

Compared with the prior art, with the first electrostatic storage unit connected to the driving line and the second electrostatic storage unit connected to the common electrode trace, the electrostatic protection circuit, the display panel, and the display apparatus according to the present disclosure can prevent leakage current on the driving line from flowing into the common electrode or prevent leakage current on the common electrode from flowing into the driving line after the switch control unit is switched off, which otherwise causes voltage fluctuation on the driving line or the common electrode line thereby affecting the display quality.

DETAILED DESCRIPTION

The technical solutions according to the embodiments of the present disclosure will be described below clearly and thoroughly in conjunction with the accompanying drawings in the embodiments of the present disclosure. It will be apparent that the described embodiments are merely a part of the embodiments of the present disclosure instead of all the embodiments. All other embodiments obtained by those of ordinary skill in the art based on the embodiments of the present disclosure without contributing any creative labor are within the protection scope of the present disclosure.

Figure 1:
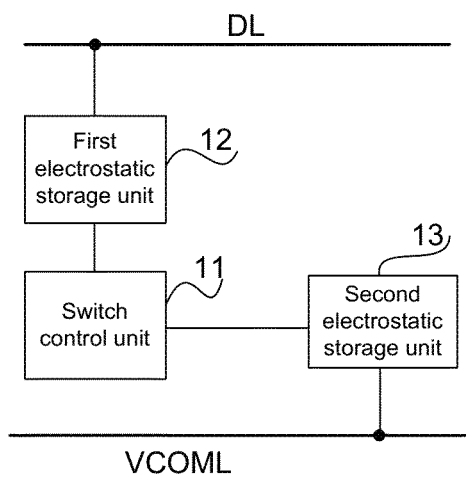
FIG. 1 is a structural diagram of an electrostatic protection circuit according to an embodiment of the present disclosure.

As shown in FIG. 1, an electrostatic protection circuit according to an embodiment of the present disclosure comprises a switch control unit 11, a first electrostatic storage unit 12 configured to store charges, and a second electrostatic storage unit 13 configured to store charges.

The first electrostatic storage unit 12 has a first terminal connected to a driving line DL and a second terminal connected to the switch control unit 11.

The second electrostatic storage unit 13 has a first terminal connected to the switch control unit 11 and a second terminal connected to a common electrode trace VCOML.

The switch control unit 11 is configured to control the second terminal of the first electrostatic storage unit 12 to be connected to the common electrode trace VCOML when a voltage variation value of a voltage on the driving line DL during a predetermined time is greater than a first predetermined voltage variation value, and control the first terminal of the second electrostatic storage unit 13 to be connected to the driving line DL when a voltage variation value of a voltage on the common electrode trace VCOML during a predetermined time is greater than a second predetermined voltage variation value.

With the first electrostatic storage unit connected to the driving line and the second electrostatic storage unit connected to the common electrode trace, the electrostatic protection circuit according to the embodiment of the present disclosure can prevent leakage current on the driving line from flowing into the common electrode trace or prevent leakage current on the common electrode trace from flowing into the driving line after the switch control unit is switched off, which otherwise causes voltage fluctuation on the driving line or the common electrode trace thereby affecting the display quality.

In the embodiment described above, a voltage variation value of a voltage on the driving line during a predetermined time being greater than a first predetermined voltage variation value means the voltage on the driving line suddenly changes, and a voltage variation value of a voltage on the common electrode trace during a predetermined time being greater than a second predetermined voltage variation value means the voltage on the common electrode trace suddenly changes.

Specifically, the driving line may comprise a data scanning line and/or a gate scanning line, and the common electrode trace may comprise a common electrode line and/or a common electrode wiring.

In a specific implementation, the first electrostatic storage unit may comprise a first capacitor and/or the second electrostatic storage unit may comprise a second capacitor.

Specifically, the switch control unit may comprise:
a first switch transistor having a first terminal connected to the driving line, a second terminal connected to the second terminal of the first electrostatic storage unit, and a third terminal connected to a first node;
a second switch transistor having a first terminal connected to the first node, a second terminal connected to the driving line, and a third terminal connected to the first terminal of the second electrostatic storage unit;
a third switch transistor having a first terminal connected to the common electrode trace, a second terminal connected to the first node, and a third terminal connected to the common electrode trace; and
a fourth switch transistor having a first terminal connected to the first terminal of the second electrostatic storage unit, a second terminal connected to the first node, and a third terminal connected to the common electrode trace.

Specifically, the switch control unit may comprise:
a first switch transistor having a first terminal connected to the driving line, a second terminal connected to the driving line, and a third terminal connected to a first node;
a second switch transistor having a first terminal connected to the first node, a second terminal connected to the second terminal of the first electrostatic storage unit, and a third terminal connected to the first terminal of the second electrostatic storage unit;
a third switch transistor having a first terminal connected to the common electrode trace, a second terminal connected to the first node, and a third terminal connected to the common electrode trace; and
a fourth switch transistor having a first terminal connected to the first terminal of the second electrostatic storage unit, a second terminal connected to the first node, and a third terminal connected to the first terminal of the second electrostatic storage unit.

In a specific implementation, all of the first switch transistor, the second switch transistor, the third switch transistor, and the fourth switch transistor are N-type transistors or all of the first switch transistor, the second switch transistor, the third switch transistor, and the fourth switch transistor are P-type transistors.

In a practical operation, the first terminal may be a gate, the second terminal may be a source, and the third terminal may be a drain, or the first terminal may be a gate, the second terminal may be a drain, and the third terminal may be a source.

The electrostatic protection circuit according to the present disclosure will be described below by way of two specific embodiments.

Figure 2:
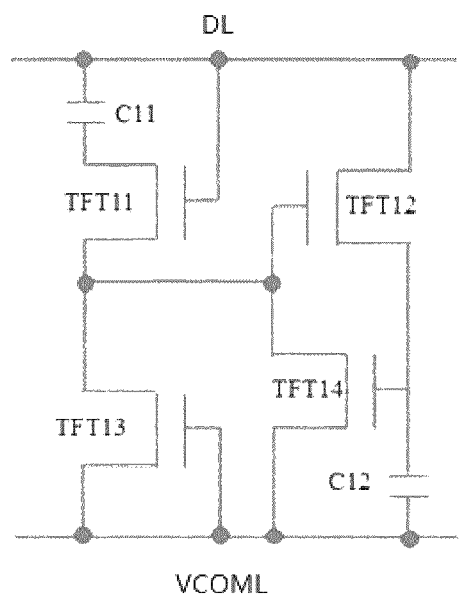
FIG. 2 is a structural diagram of an electrostatic protection circuit according to a first specific embodiment of the present disclosure.

As shown in FIG. 2, in a first specific embodiment, the electrostatic protection circuit according to the present disclosure comprises a switch control unit, a first electrostatic storage unit configured to store charges and a second electrostatic storage unit configured to store charges.

The first electrostatic storage unit comprises a first capacitor C11.

The second electrostatic storage unit comprises a second capacitor C12.

The switch control unit comprises:

a first switch transistor TFT11 having a gate connected to the driving line DL, a source connected to a second terminal of the first capacitor C11, and a drain connected to a first node P1;

a second switch transistor TFT12 having a gate connected to the first node P1, a source connected to the driving line DL, and a drain connected to a first terminal of the second capacitor C12;

a third switch transistor TFT13 having a gate connected to the common electrode trace VCOML, a source connected to the first node P1, and a drain connected to the common electrode trace VCOML; and a fourth switch transistor TFT14 having a gate connected to a first terminal of the second capacitor C12, a source connected to the first node P1, and a drain connected to the common electrode trace VCOML.

All of the TFT11, the TFT12, the TFT13 and the TFT14 are N-type transistors.

In the electrostatic protection circuit according to the first specific embodiment of the present disclosure as shown in FIG. 2, the DL may be a data scanning line or a gate scanning line, and the VCOML may be a common electrode line or a common electrode wiring.

When the electrostatic protection circuit according to the first specific embodiment of the present disclosure as shown in FIG. 2 is in operation, if a large amount of electrostatic charges are accumulated on the driving line DL, the TFT11, the TFT12, and the TFT14 are switched on, and the charges on the driving line DL and the charges on the common electrode trace VCOML achieve equalization, which avoids the ESD for the driving line DL.

When a large amount of electrostatic charges are accumulated on the common electrode trace VCOML, the TFT12, the TFT13, and the TFT14 are switched on, and the charges on the common electrode trace VCOML and the charges on the driving line DL achieve equalization, which avoids ESD for the common electrode trace VCOML.

In the specific embodiment shown in FIG. 2, the source of the TFT11 is connected to the driving line DL via the first capacitor C11, and the drain of the TFT12 is connected to the common electrode trace VCOML via the second capacitor C12, which prevents large leakage current from affecting the voltages on the driving line DL (data scanning line/gate scanning line) and the common electrode trace VCOML (common electrode line/common electrode wiring).

In the embodiment shown in FIG. 2, all of the TFT11, the TFT12, the TFT13, and the TFT14 are N-type transistors. However, in a practical operation, the TFT11, the TFT12, the TFT13, and the TFT14 may also be P-type transistors. When the voltage on the driving line DL suddenly changes from a high voltage to a low voltage, the TFT11, the TFT12, and the TFT14 are switched on, and when the voltage on the common electrode trace VCOML suddenly changes from a high voltage to a low voltage, the TFT12, the TFT13 and the TFT14 are switched on.

Figure 3:
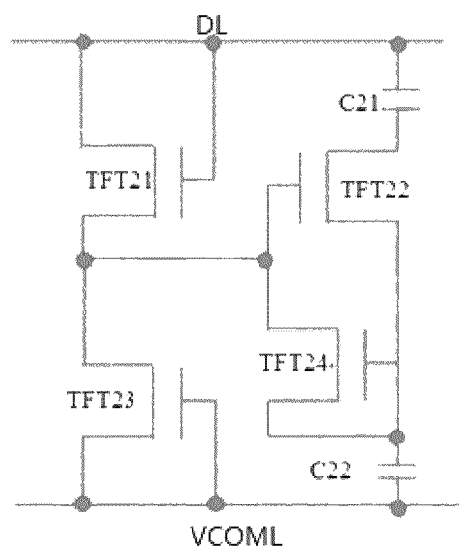
FIG. 3 is a structural diagram of an electrostatic protection circuit according to a second specific embodiment of the present disclosure.

As shown in FIG. 3, in a second specific embodiment, the electrostatic protection circuit according to the present disclosure comprises a switch control unit, a first electrostatic storage unit configured to store charges, and a second electrostatic storage unit configured to store charges.

The first electrostatic storage unit comprises a first capacitor C21.

The second electrostatic storage unit comprises a second capacitor C22.

The switch control unit comprises:

a first switch transistor TFT21 having a gate connected to the driving line DL, a source connected to the driving line DL, and a drain connected to a first node P1;

a second switch transistor TFT22 having a gate connected to the first node P1, a source connected to a second terminal of the first capacitor C21, and a drain connected to a first terminal of the second capacitor C22;

a third switch transistor TFT23 having a gate connected to the common electrode trace VCOML, a source connected to the first node P1, and a drain connected to the common electrode trace VCOML; and a fourth switch transistor TFT24 having a gate connected to a first terminal of the second capacitor C22, a source connected to the first node P1, and a drain connected to a first terminal of the second capacitor C22.

All of the TFT21, the TFT22, the TFT23 and the TFT24 may be N-type transistors.

In the electrostatic protection circuit according to the second specific embodiment of the present disclosure as shown in FIG. 3, the DL may be a data scanning line or a gate scanning line, and the VCOML may be a common electrode line or a common electrode wiring. The source of the TFT22 is connected to the driving line DL (data scanning line/gate scanning line) via the C21, and the drain of the TFT24 is connected to the common electrode trace VCOML (common electrode line/wiring) via the C22.

When the electrostatic protection circuit according to the second specific embodiment of the present disclosure as shown in FIG. 3 is in operation, if a large amount of electrostatic charges are accumulated on the driving line DL (data scanning line/gate scanning line), the TFT21, the TFT22, and the TFT24 are switched on, the electrostatic charges are released to the common electrode trace VCOML (common electrode line/wiring), and the charges on the driving line DL (data scanning line/gate scanning line) and the charges on the common electrode trace VCOML (common electrode line/wiring) achieve equalization, which avoids ESD for the driving line DL (data scanning line/gate scanning line).

When a large amount of electrostatic charges are accumulated on the common electrode trace VCOML (common electrode line/wiring), the TFT22, the TFT23, and the TFT24 are switched on, the electrostatic charges are released to the driving line DL (data scanning line/gate scanning line), and the charges on the common electrode trace VCOML (common electrode line/wiring) and the charges on the driving line DL (data scanning line/gate scanning line) achieve equalization, which avoids ESD for the common electrode trace VCOML (common electrode line/wiring).

In the second specific embodiment shown in FIG. 3, the source of the TFT22 is connected to the driving line DL (data scanning line/gate scanning line) via the capacitor C21, and the gate and the drain of the TFT24 are connected to the common electrode trace VCOML (common electrode line/wiring) via the C22, which prevents large leakage current from affecting the voltages on the driving line DL (data scanning line/gate scanning line) and the common electrode trace VCOML (common electrode line/wiring).

In the embodiment shown in FIG. 3, all of the TFT21, the TFT22, the TFT23, and the TFT24 may be N-type transistors. However, in a practical operation, the TFT21, the TFT22, the TFT23, and the TFT24 may also be P-type transistors. When the voltage on the driving line DL suddenly changes from a high voltage to a low voltage, the TFT21, the TFT22, and the TFT24 are switched on, and when the voltage on the common electrode trace VCOML suddenly changes from a high voltage to a low voltage, the TFT22, the TFT23 and the TFT24 are switched on.

A display panel according to an embodiment of the present disclosure comprises the electrostatic protection circuit described above.

A display apparatus according to an embodiment of the present disclosure comprises the display panel described above.

The foregoing is preferred embodiments of the present disclosure and it should be noted that several improvements and modifications can be made by those skilled in the art without departing from the principles of the present disclosure and such improvements and modifications should also be regarded as falling in the protection scope of the present disclosure.

What is claimed is:

1. An electrostatic protection circuit, comprising:
   a switch control unit;
   a first electrostatic storage unit consisting of a first capacitor having a first terminal electrically connected to a driving line and a second terminal electrically connected to the switch control unit; and
   a second electrostatic storage unit consisting of a second capacitor having a first terminal electrically connected to the switch control unit and a second terminal electrically connected to a common electrode trace,
   wherein the switch control unit is configured to control the second terminal of the first capacitor to be electrically connected to the common electrode trace when a voltage variation value of a voltage on the driving line during a first predetermined time period is greater than a first predetermined voltage variation value,
   wherein the switch control unit is further configured to control the first terminal of the second capacitor to be electrically connected to the driving line when a voltage variation value of a voltage on the common electrode trace during a second predetermined time period is greater than a second predetermined voltage variation value, and
   wherein the switch control unit comprises:
      a first switch transistor having a first terminal electrically connected to the driving line, a second terminal electrically connected to the second terminal of the first electrostatic storage unit, and a third terminal electrically connected to a first node;
      a second switch transistor having a first terminal electrically connected to the first node, a second terminal electrically connected to the driving line, and a third terminal electrically connected to the first terminal of the second electrostatic storage unit;
      a third switch transistor having a first terminal electrically connected to the common electrode trace, a second terminal electrically connected to the first node, and a third terminal electrically connected to the common electrode trace; and
      a fourth switch transistor having a first terminal electrically connected to the first terminal of the second electrostatic storage unit, a second terminal electrically connected to the first node, and a third terminal electrically connected to the common electrode trace.

2. The electrostatic protection circuit according to claim 1, wherein the driving line comprises a data scanning line and/or a gate scanning line, and the common electrode trace comprises a common electrode line and/or a common electrode wiring.

3. The electrostatic protection circuit according to claim 1, wherein all of the first switch transistor, the second switch transistor, the third switch transistor, and the fourth switch transistor are N-type transistors, or all of the first switch transistor, the second switch transistor, the third switch transistor, and the fourth switch transistor are P-type transistors.

4. A display panel comprising the electrostatic protection circuit according to claim 1.

5. A display apparatus comprising the display panel according to claim 4.

6. An electrostatic protection circuit, comprising:
   a switch control unit;
   a first electrostatic storage unit consisting of a first capacitor having a first terminal electrically connected to a driving line and a second terminal electrically connected to the switch control unit; and
   a second electrostatic storage unit consisting of a second capacitor having a first terminal electrically connected to the switch control unit and a second terminal electrically connected to a common electrode trace,
   wherein the switch control unit is configured to control the second terminal of the first capacitor to be electrically connected to the common electrode trace when a voltage variation value of a voltage on the driving line during a first predetermined time period is greater than a first predetermined voltage variation value,
   wherein the switch control unit is further configured to control the first terminal of the second capacitor to be electrically connected to the driving line when a voltage variation value of a voltage on the common electrode trace during a second predetermined time period is greater than a second predetermined voltage variation value, and
   wherein the switch control unit comprises:
      a first switch transistor having a first terminal electrically connected to the driving line, a second terminal electrically connected to the driving line, and a third terminal electrically connected to a first node;
      a second switch transistor having a first terminal electrically connected to the first node, a second terminal electrically connected to the second terminal of the first electrostatic storage unit, and a third terminal electrically connected to the first terminal of the second electrostatic storage unit;
      a third switch transistor having a first terminal electrically connected to the common electrode trace, a second terminal electrically connected to the first node, and a third terminal electrically connected to the common electrode trace; and
      a fourth switch transistor having a first terminal electrically connected to the first terminal of the second electrostatic storage unit, a second terminal electrically connected to the first node, and a third terminal electrically connected to the first terminal of the second electrostatic storage unit.

7. The electrostatic protection circuit according to claim 6, wherein all of the first switch transistor, the second switch transistor, the third switch transistor, and the fourth switch transistor are N-type transistors, or all of the first switch transistor, the second switch transistor, the third switch transistor, and the fourth switch transistor are P-type transistors.

* * * * *